United States Patent [19]
Otsuki et al.

[11] Patent Number: 5,777,380
[45] Date of Patent: Jul. 7, 1998

[54] RESIN SEALING TYPE SEMICONDUCTOR DEVICE HAVING THIN PORTIONS FORMED ON THE LEADS

[75] Inventors: Tetsuya Otsuki; Tadami Ito, both of Suwa, Japan

[73] Assignee: Seiko Epson Corporation, Tokyo, Japan

[21] Appl. No.: 615,869

[22] Filed: Mar. 14, 1996

[30] Foreign Application Priority Data

Mar. 17, 1995 [JP] Japan .................................. 7-086516
Dec. 7, 1995 [JP] Japan .................................. 7-345328

[51] Int. Cl.$^6$ .................. H01L 23/495; H01L 23/10;
H01L 23/34; H01L 23/28
[52] U.S. Cl. .................. 257/675; 257/706; 257/707;
257/796; 257/674
[58] Field of Search .................. 257/669, 674,
257/675, 668, 706, 707, 796

[56] References Cited

U.S. PATENT DOCUMENTS

| | | | |
|---|---|---|---|
| 3,212,569 | 10/1965 | McAdam | 251/675 |
| 3,290,564 | 12/1966 | Wolff, Jr. | 257/675 |
| 3,965,277 | 6/1976 | Guditz et al. | 257/675 |
| 4,151,543 | 4/1979 | Hayakawa et al. | 257/675 |
| 4,684,975 | 8/1987 | Takiar et al. | 257/675 |
| 4,942,497 | 7/1990 | Mine et al. | 257/675 |
| 5,050,040 | 9/1991 | Gondusky et al. | 257/675 |
| 5,105,259 | 4/1992 | McShane et al. | 257/655 |
| 5,157,478 | 10/1992 | Ueda et al. | 257/675 |
| 5,172,213 | 12/1992 | Zimmerman | 257/675 |
| 5,200,809 | 4/1993 | Kwon | 257/675 |
| 5,202,288 | 4/1993 | Doering et al. | 257/675 |
| 5,208,188 | 5/1993 | Newman | 257/675 |
| 5,227,662 | 7/1993 | Ohno et al. | 257/675 |
| 5,229,643 | 7/1993 | Ohta et al. | 257/675 |
| 5,252,855 | 10/1993 | Ogawa et al. | 257/675 |
| 5,262,927 | 11/1993 | Chia et al. | 257/675 |
| 5,328,870 | 7/1994 | Marrs | 257/675 |
| 5,345,106 | 9/1994 | Doering et al. | 257/675 |
| 5,367,196 | 11/1994 | Mahulikar et al. | 257/675 |
| 5,381,042 | 1/1995 | Lerner et al. | 257/675 |
| 5,438,478 | 8/1995 | Kondo et al. | 257/675 |
| 5,444,025 | 8/1995 | Sono et al. | 257/675 |
| 5,455,453 | 10/1995 | Harada et al. | 257/675 |
| 5,455,462 | 10/1995 | Marrs | 257/675 |
| 5,545,921 | 8/1996 | Conru et al. | 257/669 |

FOREIGN PATENT DOCUMENTS

| | | | |
|---|---|---|---|
| 0 164 794 A2 | 12/1985 | European Pat. Off. . | |
| 0 436 126 A2 | 7/1991 | European Pat. Off. . | |
| A-54-124678 | 9/1979 | Japan . | |
| A-56-122134 | 9/1981 | Japan . | |
| A-58-12341 | 1/1983 | Japan . | |
| A-59-207645 | 11/1984 | Japan . | |
| A-61-166051 | 7/1986 | Japan . | |
| A-62-97358 | 5/1987 | Japan . | |
| 62-254456 | 11/1987 | Japan | 257/669 |
| A-63-179557 | 7/1988 | Japan . | |
| A-63-240053 | 10/1988 | Japan . | |
| A-6-66351 | 3/1989 | Japan . | |
| 1207939 | 8/1989 | Japan | 257/669 |

(List continued on next page.)

OTHER PUBLICATIONS

Karnezos, M. et al., "EDQUAD — An Enhanced Performance Plastic Package," *Proceedings of the Electronic Components and Technology Conference,* Institute of Electrical and Electronics Engineers, 1994, pp. 63–66.

*Primary Examiner*—Teresa M. Arroyo
*Attorney, Agent, or Firm*—Oliff & Berridge

[57] ABSTRACT

A resin sealing type semiconductor device includes a radiator, a semiconductor element, a frame lead arranged at a distance around this semiconductor element and displaced from the radiator, and a plurality of leads extending from this frame lead and attached to a mounting surface with a insulating lead support therebetween. The leads are pressed downward by an upper mold so that the radiator is pressed against a lower mold in such a manner that resin cannot seep therebetween. Thin portions are formed in the leads to ensure that the leads do not peel away from the insulating lead support.

5 Claims, 12 Drawing Sheets

FOREIGN PATENT DOCUMENTS

| | | |
|---|---|---|
| 2-18955 | 1/1990 | Japan . |
| 286155 | 3/1990 | Japan ................................. 257/674 |
| A-2-307251 | 12/1990 | Japan . |
| A-3-222464 | 10/1991 | Japan . |
| A-3-280453 | 12/1991 | Japan . |
| A-4-10558 | 1/1992 | Japan . |
| A-4-11758 | 1/1992 | Japan . |
| A-427145 | 1/1992 | Japan . |
| A-4-91458 | 3/1992 | Japan . |
| A-4-158556 | 6/1992 | Japan . |
| A-4-174551 | 6/1992 | Japan . |
| A-4-199664 | 7/1992 | Japan . |
| A-4-230056 | 8/1992 | Japan . |
| A-4-316357 | 11/1992 | Japan . |
| 5109928 | 4/1993 | Japan ................................. 257/669 |
| A-5-211262 | 8/1993 | Japan . |
| A-6-53390 | 2/1994 | Japan . |
| A-6-97321 | 4/1994 | Japan . |
| A-6-97326 | 4/1994 | Japan . |
| 6-216505 | 8/1994 | Japan . |
| 6-224363 | 8/1994 | Japan . |

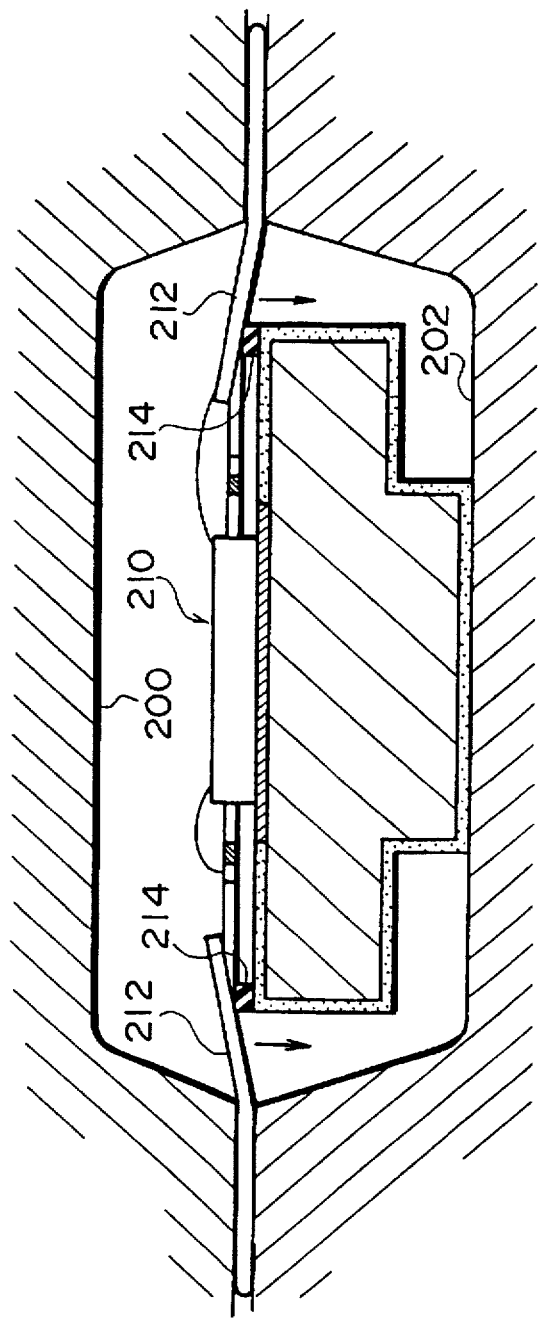

RESIN SEALING TYPE SEMICONDUCTOR DEVICE HAVING THIN PORTIONS FORMED ON THE LEADS

BACKGROUND OF THE INVENTION

1. Field of the Invention

This invention relates to a semiconductor device characterized by the lead construction thereof, and a method of fabricating the same.

2. Description of Related Art

Recent increases in the power dissipations of Very Large Scale Integrated circuits (VLSIs) and other devices have intensified demands for an inexpensive plastic package with good thermal radiation properties. Various methods have been considered to meet these demands. From the materials point of view, studies have been done concerning how to increase the thermal conductivity of the lead frame and the resin used for sealing. From the structural point of view, studies have been done concerning improving the thermal radiation characteristics by modifying the lead frame design and adding a heat sink, in other words a radiator. The most orthodox solution is considered to be improving the thermal radiation characteristics of the package by adding a radiator, to produce a Large Scale Integrated circuit (LSI) with a power dissipation of up to about 2 Watts per chip.

The present inventors have already disclosed an invention intended to address the specific problem of thermal radiation, in JP 6-53390. This invention makes use of a radiator that has a good thermal conductivity, in a configuration in which this radiator functions as an element mount in place of a die pad. In this case, the inner leads are configured to be positioned on an insulating member placed on the radiator and are supported by this insulating member.

A highly integrated semiconductor device such as a logic VLSI has a large number of electrodes (pads) for input, output and power-supply with respect to the semiconductor chip. This means that the wiring design of the wires and leads connecting these electrodes is very important.

One technique for reducing the problems caused by this wiring design is the semiconductor device disclosed in JP 4-174551. This semiconductor device has a common inner lead that is placed over the surface of the semiconductor chip on which the circuitry is formed, with an insulating adhesive therebetween. A plurality of inner signal leads is provided around the outside of the semiconductor chip, electrically connected to the semiconductor chip, and the semiconductor chip is sealed in by molding resin while it is supported by this common inner lead.

This semiconductor device has various advantages. One is the lack of a tab for mounting the semiconductor chip, which makes it possible to prevent short-circuiting between the bonding wires and the tab. Another advantage is the way in which the common inner lead can be used as a power lead, for example, so that the sharing of a lead pin can be implemented simply.

However, this semiconductor device also causes several problems. The overlaying of the common inner lead on the surface of the semiconductor chip imposes restrictions on the arrangement of the electrode pads on the semiconductor chip. In addition, the chip can become contaminated by the adhesive used to bond the common inner lead to the semiconductor chip, and bonding defects can be caused by softening of this adhesive.

The present inventors have made an invention intended to solve these problems in co-pending U.S. patent application Ser. No. 08/461,442. In a preferred embodiment of this invention, a semiconductor chip is mounted on an element mounting member that functions as a heat sink, and the leads are attached to this element mounting member with an insulating lead support therebetween. Since there is no need for a tab and thus associated bonding defects can be prevented, this enables highly reliable wire-bonding. The provision of a common lead (frame lead) around the semiconductor chip, but separated from the element mounting member, makes it possible to use this lead in common. The use of a heat sink as the element mounting member makes it possible to improve the thermal radiation characteristics.

Several problems were discovered during the resin sealing process when the above invention was put into practice, as described below.

As shown in FIG. 13, during this resin sealing process, leads 212 of a semiconductor device 210 are pinched between an upper mold 200 and a lower mold 202 before the actual resin sealing is performed, and the leads 212 are pressed down toward a lead support 214 by the upper mold 200. The reason for this is to ensure that the semiconductor device 210 is pressed into intimate contact with the lower mold 202 and thus ensure accurate molding at a predetermined position.

However, when this happens, the portions of the leads 212 that are immediately inside the upper mold 200 and the lower mold 202 are bent sharply. Since the leads 212 inside thereof stay straight, the adhesions to the lead support 214 are steeply inclined and thus the bonding therebetween tends to peel away.

Further research by the present inventors has resulted in a semiconductor device and fabrication method intended to solve this problem.

This problem is caused by the configuration in which the leads are attached to the element mounting member with a lead support therebetween. The use of a heat sink as the element mounting member and the provision of a common lead (frame lead) have no direct connection to this problem.

The thin portion that is one of the characteristic features of this invention has already been disclosed in JP 63-179557 as a thin portion formed in part of a lead, providing a configuration wherein a lead bends easily. However, the objective of the present invention differs from that of the above specification, in that the formation of the thin portion is intended to address the problems raised during the fabrication of new types of semiconductor device related to co-pending U.S. patent application Ser. No. 08/461,442.

SUMMARY OF THE INVENTION

An objective of this invention is to provide a resin sealing type semiconductor device that enables highly reliable sealing of a resin sealing type semiconductor device that has a configuration wherein the leads are attached to the element mounting member with a lead support therebetween (in other words, a configuration without a tab), and a method of fabricating such a device. Another objective of this invention is to provide a resin sealing type semiconductor device that enables a highly flexible wiring design by making a lead common, and a method of fabricating such a device.

A further objective of this invention is to provide a resin sealing type semiconductor device that has good thermal radiation characteristics, and a method of fabricating such a device.

The resin sealing type semiconductor device in accordance with this invention comprises a semiconductor element, an element mounting member having a mounting surface for mounting the semiconductor element, an insulating lead support disposed on the mounting surface of the element mounting member, a plurality of leads fixed to the element mounting member by adhesion to the lead support, and a resin package sealing the element mounting member, the semiconductor element, and parts of the leads, using a mold. The insulating lead support is separated from the semiconductor element. At least one thin portion is formed in a lead within a region thereof sealed in resin.

With this aspect of the invention, a thin portion is formed in an area of a lead that is sealed in the resin, and this thin portion easily deforms elastically. Therefore, the leads are pressed down by the mold and the components to be sealed in the resin are set in an appropriate position by the pressure on the leads, before the resin sealing is performed. This makes it possible to perform the resin sealing with the components in appropriate positions. This also makes it possible to prevent separation of the adhesion between the leads and the lead support, by weakening the pressure on the leads and transferring it to the lead support.

In this case, the thin portion is preferably formed at any position within the region between the interior of the mold and the area over which the lead is attached to the lead support, and it could be formed at the position at which the lead is attached to the lead support. It is further preferable that no thin portion is formed in a lead at a position thereof that protrudes towards the semiconductor element from the lead support. Since this area of the lead is subjected to bonding for the connection of a wire, it is preferable that the strength thereof is not impaired.

From consideration of the possibility of an error in positioning between the lead and the lead support, it is preferable that a thin, wide portion is formed in the lead, so that the thin portion is arranged over an area that extends from the interior of the mold to the area over which the lead is attached to the lead support. However, if this thin, wide portion is formed by means of wet etching, which is isotropic, it should be noted that part of the thin portion could become too thin.

In such a case, a plurality of thin, narrow portions could be formed in a lead. With this configuration, the thickness of each thin portion can be made comparatively large, so that deformation, cracking, and twisting of the lead can be prevented.

This plurality of thin portions preferably comprises a first thin portion formed at any position within a region extending from the interior of the mold to the area over which the lead is attached to the lead support, a second thin portion formed at a position on the edge of the area over which the lead is attached to the lead support, and a third thin portion formed in the area over which the lead is attached to the lead support.

With this configuration, the first or third thin portion can accommodate any error in the adhesion position of the lead that would move the second thin portion away from the edge of the adhesion position.

The above thin portion could be formed as a depression in only one surface of the lead. Alternatively, if a plurality of thin portions are formed, at least one thin portion could be formed as a depression in one surface of each of the leads, with the remaining thin portion or portions being formed as one or more depressions in the other surface of the lead.

It is also preferable that an element mounting member having good thermal radiation characteristics is used, to improve the thermal radiation characteristics of the semiconductor element.

If the frame lead is provided to surround the semiconductor element and this frame lead is used in common as a power lead, for example, a predetermined voltage can be supplied stably by a small number of leads to the electrodes of the semiconductor element, enabling an increase in operating speed with reduced power supply noise. Since the number of leads that are released by making the frame lead common can now be used for other purposes, such as signal leads, the flexibility of the wiring design is improved.

The method of fabricating a resin sealing type semiconductor device in accordance with this invention comprises the steps of:

mounting a semiconductor element on a mounting surface of an element mounting member;

disposing an insulating lead support on the mounting surface which is separated from the semiconductor element;

fixing a plurality of leads to the element mounting member by adhesion to the insulating lead support;

electrically connecting predetermined portions by a wire-bonding means;

setting an intermediate member obtained by the above steps on a first half mold;

pressing parts of the leads of the intermediate member that project out of the lead support by a second mold, these parts of the leads being pressed in the direction towards the lead support; and sealing the intermediate member into a resin package within the first and second molds; wherein at least one of the leads has a thin portion formed at a position between the interior of the first and second molds and the area over which the lead is attached to the lead support.

In this case, the parts of the leads projecting outside the lead support are preferably positioned above the first half mold and are bent by the second half mold.

The intermediate member is sealed into the resin package with the lead in which the above described thin portion is formed being bent towards the surface thereof attached to the lead support, from outside the area over which the lead is attached to the lead support.

BRIEF DESCRIPTION OF THE DRAWINGS

FIG. 13 is an illustrative view of the molding technique that is a premise of this invention.

DETAILED DESCRIPTION OF PREFERRED EMBODIMENTS

Figure 1:
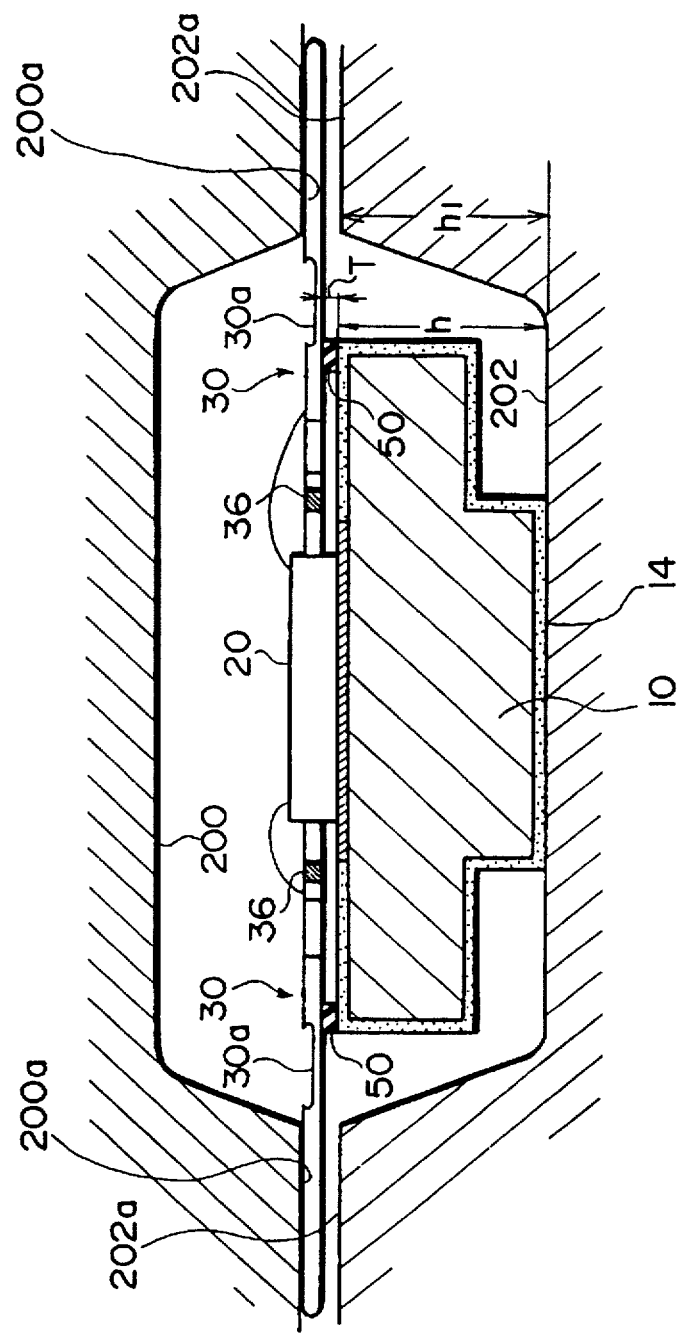
FIG. 1 is a cross-sectional view showing the method of fabricating a semiconductor device in accordance with an embodiment of this invention.
Figure 2:
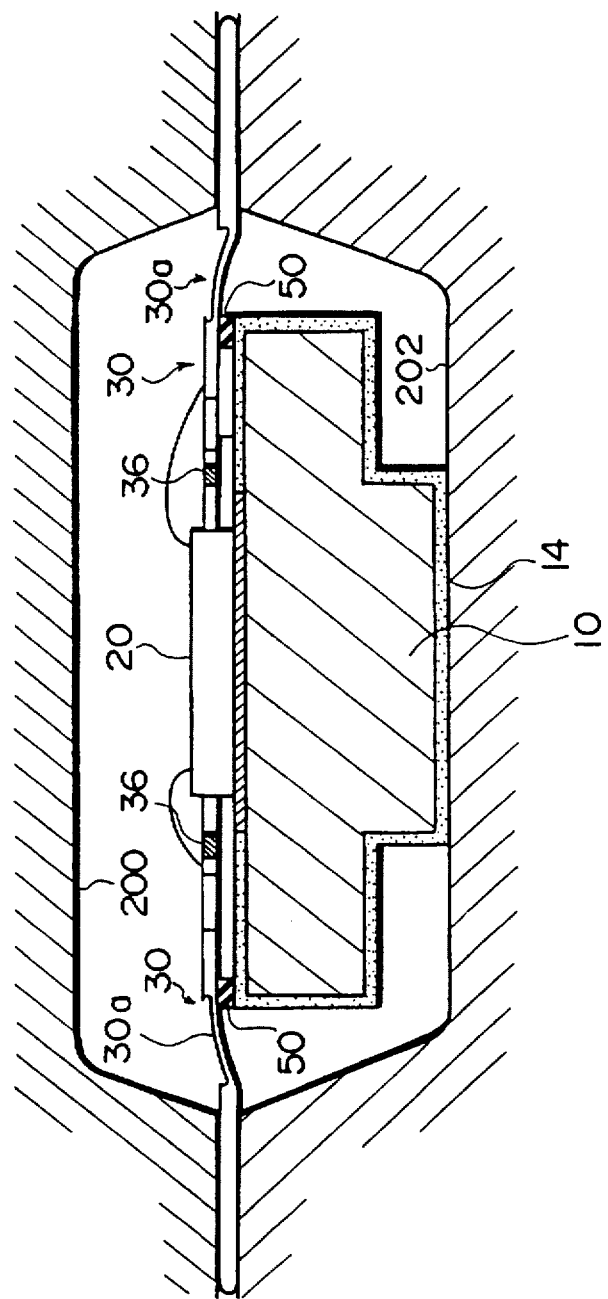
FIG. 2 is a further cross-sectional view showing the method of fabricating a semiconductor device in accordance with this embodiment of this invention.
Figure 3:
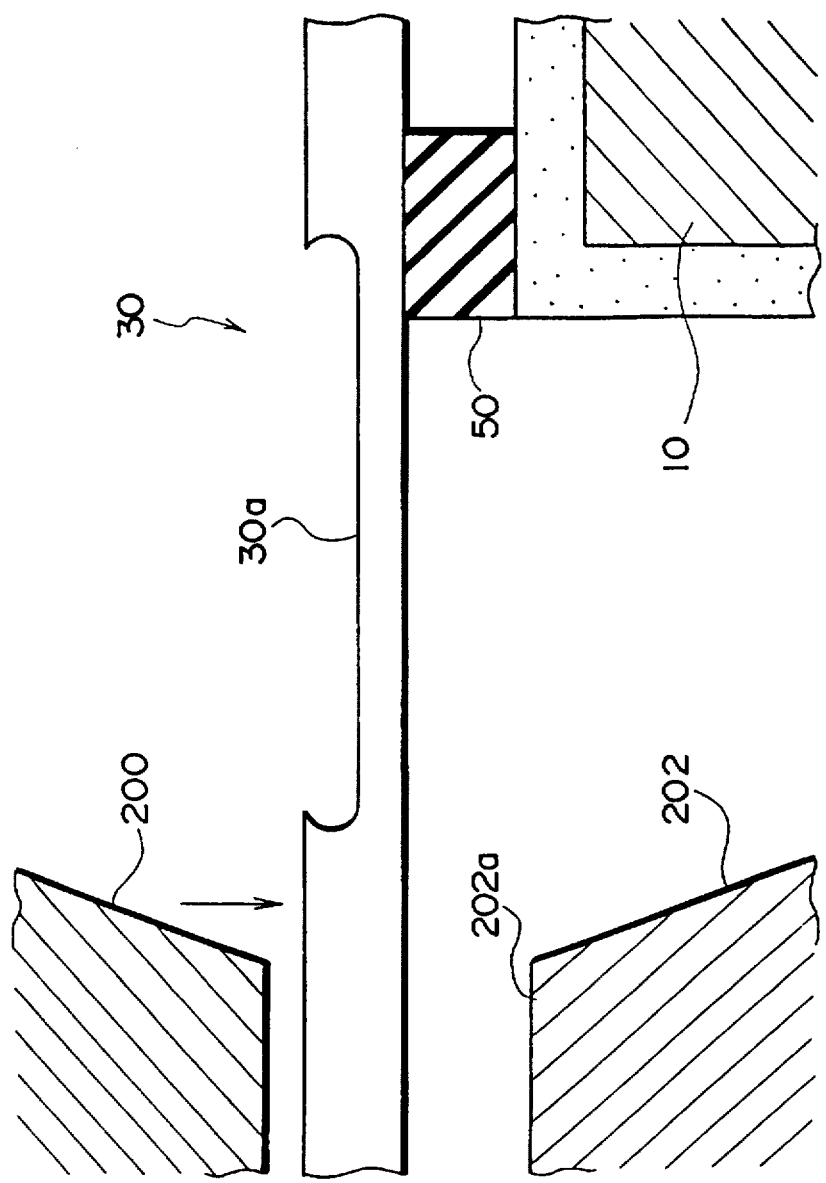
FIG. 3 is an enlarged view of part of FIG. 1.

A method of fabricating a semiconductor device in accordance with an embodiment of this invention is shown in FIG. 1 and FIG. 2, with part of FIG. 1 being shown enlarged in FIG. 3.

First of all, the description concerns the configuration of a semiconductor device to which the present invention is applied, to illustrate the premises behind this fabrication method.

Figure 4:
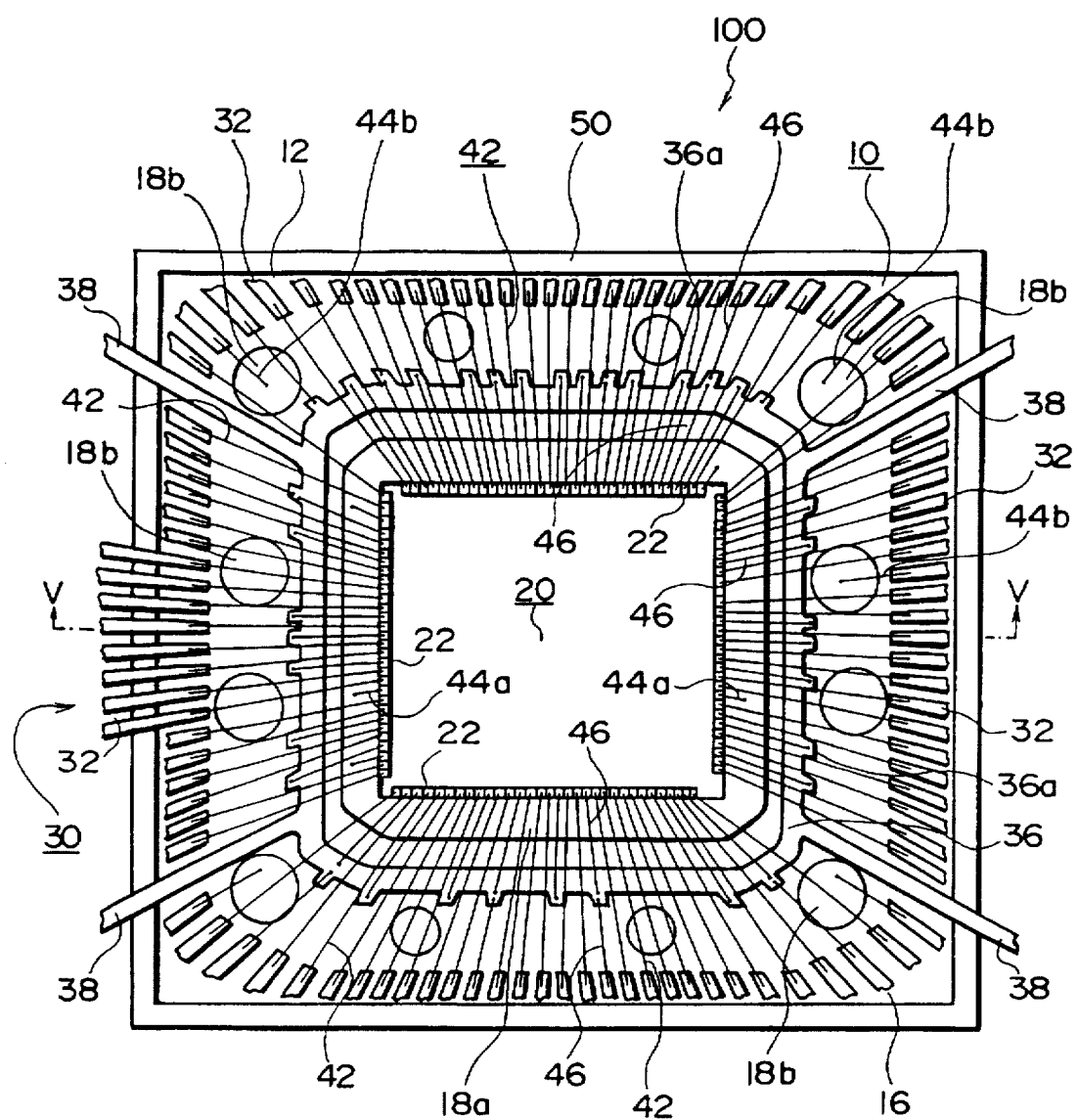
FIG. 4 is a plan view schematically showing essential portions of a semiconductor device fabricated by the application of this invention.

A schematic plan view of a semiconductor device fabricated in accordance with this invention is shown in FIG. 4, before it is placed in the resin package. A cross-sectional view taken along the line V—V of FIG. 4 is shown in FIG. 5.

A semiconductor device 100 of this embodiment comprises a radiator 10, a semiconductor element 20 attached to a mounting surface 12 of the radiator 10, a plurality of leads 30 fixed to the radiator 10 by a lead support 50, and a frame lead 36 disposed around the outside of the semiconductor element 20.

Figure 5:
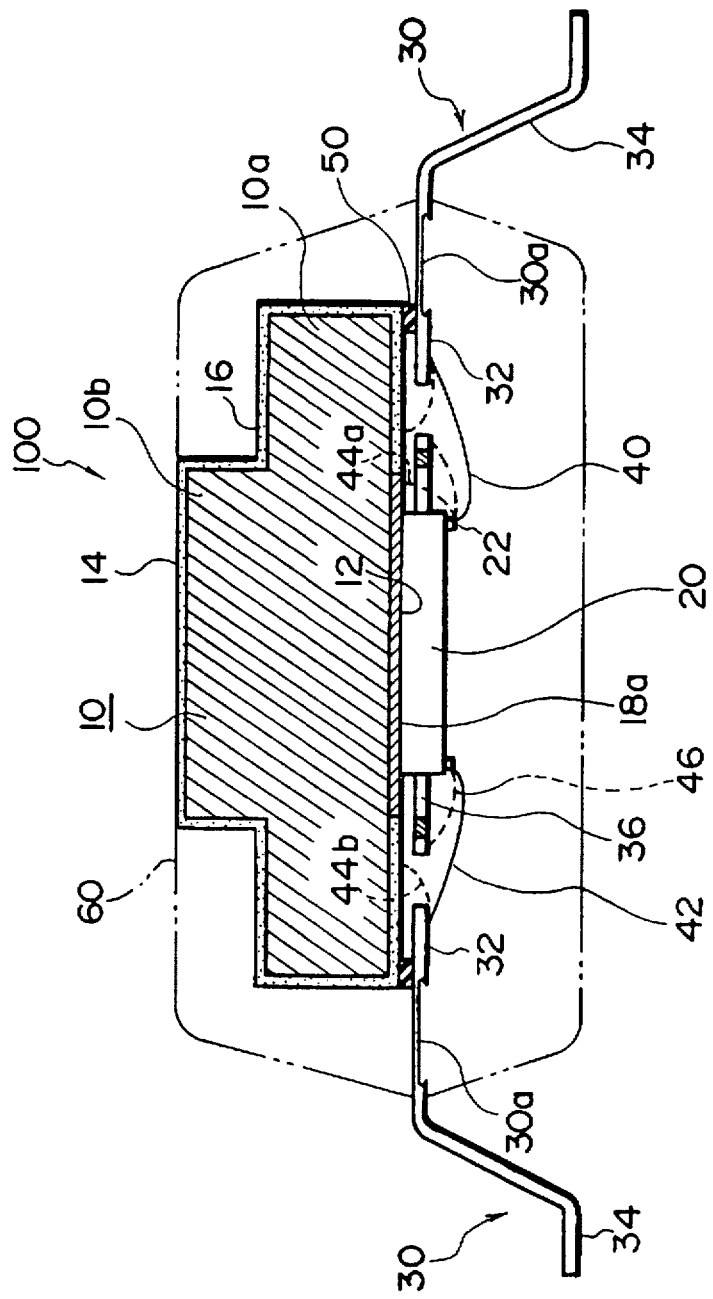
FIG. 5 is a schematic cross-sectional view taken along the line V—V in FIG. 4.

The radiator 10 consists of a large portion 10a and a small portion 10b protruding from the large portion 10a, thus substantially forming an inverted T-shape in cross-section as shown in FIG. 5. The lower surface of the large portion 10a forms the mounting surface 12 and an upper surface of the small portion 10b forms an exposed surface 14.

On the mounting surface 12 is formed a first conducting layer 18a having a region on which the semiconductor element 20 is disposed, with the surface area of the first conducting layer 18a being larger than that of this region, and a plurality of spot-shaped second conducting layers 18b that are separated from the first conducting layer 18a, as shown in FIG. 4. An insulating layer 16 is formed on the surface of the radiator 10 that is not covered by the conducting layers 18a and 18b.

The radiator 10 is preferably formed from an electrically conductive material that has a good thermal conductivity, such as copper, aluminum, silver, or gold, or of an alloy having those materials as principle components, and is more preferably of copper if economic considerations are taken into account.

There is no particular restriction on the material used to form the conducting layers 18a and 18b, but silver, gold, palladium, and aluminum can be cited as examples. If conductivity and bonding with the semiconductor element 20 are considered, silver is particularly preferred. These conducting layers 18a and 18b could be formed by a method such as plating or bonding, and they are used as grounding surfaces as described in detail below.

There is also no particular restriction on the material used for the insulating layer 16, as long as it has good insulating properties, but it is preferably a metal oxide obtained by, for example, oxidizing the metal that forms the radiator 10. If the radiator 10 is formed of copper, for instance, the insulating layer 16 could be obtained by applying a strongly alkaline reagent to oxidize the surface thereof. The provision of the insulating layer 16 makes it possible to prevent short-circuiting from the leads 30 or the frame lead 36 to the radiator 10. A further advantage of an insulating layer 16 formed of copper oxide lies in its normally dark color, such as black or brown, which makes it easier to distinguish the leads 30 by means of an image recognition system during wire-bonding. Copper oxide also has good bonding properties with respect to the resin used to form a resin package 60, thus improving the mechanical strength of the package.

The semiconductor element 20 is bonded by means such as a silver paste to the first conducting layer 18a that is formed on the mounting surface 12 of the radiator 10. A plurality of electrode pads 22 are then formed in a predetermined arrangement on the surface of the semiconductor element 20.

The lead support 50 is adhered continuously around the periphery of the mounting surface 12. This lead support 50 is formed of a strip-shaped member of an insulating resin which could be a thermosetting resin such as a polyimide or epoxy resin.

The lead support 50 is disposed in such a manner that part of the portion facing the mounting surface 12 of the radiator 10 in each of the leads 30 is fixed, but the entire portion facing the mounting surface 12 in each of the leads 30 could be fixed.

Inner leads 32 that each form part of the leads 30 are adhered by bonding to the lead support 50 at a predetermined distance L from the ends thereof. Thus the inner leads 32 are fixed to the radiator 10 by the lead support 50, with the ends thereof being left free as shown enlarged in FIG. 6. The inner leads 32 are electrically connected to the electrode pads 22 of the semiconductor element 20 by wires 42, 44a, 44b, and 46 of a metal such as gold or silver.

The characteristic feature of this embodiment lies in the fact that a thin portion 30a is formed in each of the leads 30. These thin portions 30a are designed to prevent the leads 30 from peeling away from the lead support 50 during the resin sealing in the process of fabricating the semiconductor device 100. This will be described in detail later, with the fabrication method.

Figure 7:
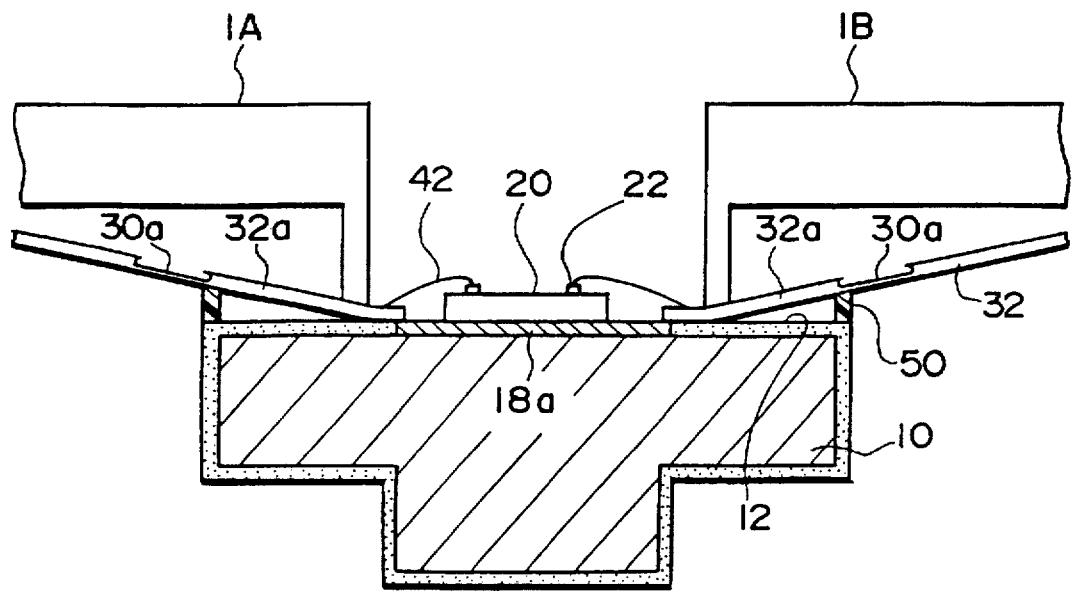
FIG. 7 is an illustrative view of the step of wire-bonding the inner leads;.
Figure 8:
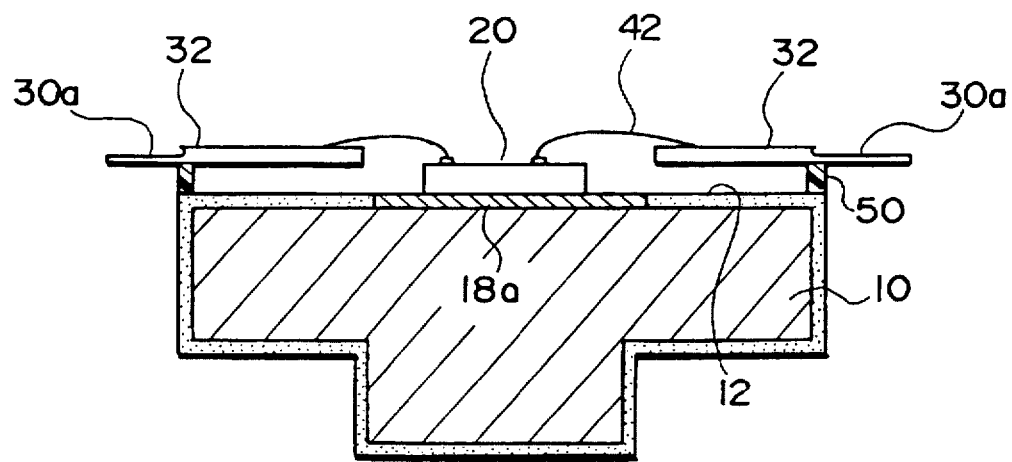
FIG. 8 shows the state after the wire-bonding of FIG. 7 is completed.

The wire-bonding of the inner leads 32 to the electrode pads 22 is illustrated in FIGS. 7 and 8. First of all, lead pressers 1A and 1B press down on end portions 32a of the inner leads 32. These end portions 32a are free to move, so they are deformed downward about the lead support 50 acting as a fulcrum and come into contact with the mounting surface 12, as shown in FIG. 7. The wire-bonding is done in this state, enabling a firm, reliable connection of the wires 42. After this wire bonding is completed, the lead pressers 1A and 1B are removed, allowing the inner leads 32 to return by their own elasticity to being supported in a horizontal position, as shown in FIG. 8. The inner leads 32 are electrically insulated from the radiator 10 by the lead support 50.

When considering this bonding process and the mechanical stability of the inner leads 32, it is clear that certain requirements must be satisfied. For instance, the end portions 32a must be of sufficient length to come into contact with the mounting surface 12, within the limits of the elastic deformation thereof, and they must also have sufficient mechanical strength to enable them to return completely to their original horizontal position after the bonding is completed. The length and mechanical strength of the end portions 32a of the inner leads 32 should be set to satisfy these conditions. These conditions can be obtained in various forms depending on factors such as the size of the device, the design features of the semiconductor element, and the strength of the leads. The lead support 50 must also satisfy certain requirements. For instance, it must be able to support the inner leads 32 stably, be of a thickness sufficient to enable the end portions 32a of the inner leads 32 to be insulated electrically from the radiator 10, and also deform or deteriorate only minimally when it is processed by heat.

Figure 6:
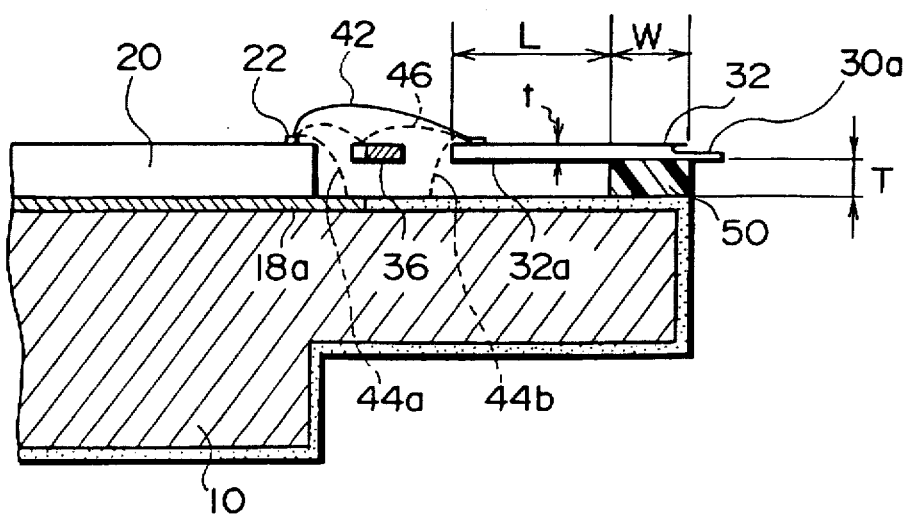
FIG. 6 is an enlarged cross-sectional view showing the essential portions of FIG. 4.

In consideration of the above points, the following design rules may be given as numerical examples for the parameters shown in FIG. 6, where W is the width of the lead support 50, T is the thickness of the lead support 50, L is the length of each free end 32a of the inner leads 32, and t is the thickness of the inner leads 32:

W: 0.5 mm to 2 mm
T: 0.025 mm to 0.125 mm
t: 0.10 mm to 0.30 mm
L: at least 2.0 mm and more The connection of the grounding wires will now be described with reference to FIGS. 4 and 6.

The conducting layers 18a and 18b on the radiator 10 act as grounding surfaces. More specifically, the first conducting layer 18a can be made common by connecting a plurality of electrode pads 22 to the exposed surface of the first conducting layer 18a by grounding wires 44a. Similarly, the second conducting layers 18b can be used as grounding surfaces for the inner leads 32 by connecting the leads to the second conducting layers 18b by grounding wires 44b. In this manner, the conducting layers 18a and 18b function as a common grounding layer for the electrode pads 22 and separate grounding layers for the inner leads 32, respectively. This enables a reduction in the number of leads that are made common for grounding, thus increasing the number of leads available for other uses, such as signal leads, which increases the flexibility of the wiring design.

The grounding provided by the conducting layers 18a and 18b can take many forms, such as the examples given below.

a. If there is no ground on the electrode pad 22 side of the semiconductor element 20, a path is formed from the back surface of the semiconductor element 20, through the radiator 10, to the conducting layers 18a and 18b, and at least one of the inner leads 32 is connected to the conducting layers 18a and 18b. This enables the potential of the back surface of the semiconductor element 20 to be the same as the potential of the inner leads 32. If the radiator 10 is at ground potential, the potential of the back surface of the semiconductor element 20 and that of the inner leads 32 are also at ground potential.

b. A large number of the electrode pads 22 of the semiconductor element 20 are connected to the conducting layers 18a and 18b, and a few of the inner leads 32 are connected to the conducting layers 18a and 18b. If the radiator 10 is at ground potential, the potentials of the electrode pads 22 and the inner leads 32 are also at ground potential. This ensures that a large number of grounding points from the semiconductor element 20 are obtained by a small number of the inner leads 32, and thus a stable ground potential is obtained.

c. A path is formed from the back surface of the semiconductor element 20, through the radiator 10, and to the conducting layers 18a and 18b; one of the electrode pads 22 of the semiconductor element 20 is connected to the conducting layers 18a and 18b; and an inner lead 32 that is grounded is connected to the conducting layers 18a and 18b. If the radiator 10 is at ground potential, the potentials of the back surface of the semiconductor element 20, the electrode pads 22, and the inner leads 32 are also at ground potential. Since this makes it possible to set the potentials of components such as back surface of the semiconductor element 20, the electrode pads 22, and the inner leads 32 at the same potential, the potential of the semiconductor element 20 is stabilized and thus the operation is stabilized.

The frame lead 36 is disposed in such a manner that it is not in contact with either the semiconductor element 20 or the inner leads 32, and it is preferably provided in a position such that it is displaced from the conducting layers 18a and 18b in that plane, to prevent short-circuiting. This frame lead 36 is supported stably by four support leads 38. A portion of each of the support leads 38 is fixed by the lead support 50.

The frame lead 36 has a plurality of identification protrusions 36a formed thereon at predetermined positions, as shown in FIG. 4. These identification protrusions 36a facilitate the identification of bonding positions during the wire bonding process.

In other words, the wire-bonding is done as described below. Reference coordinates for the electrode pads 22 on the semiconductor element 20 and the bonding positions of the frame lead 36 are stored beforehand. Image recognition is used to detect any deviations of the actual coordinates of the electrode pads 22 to be bonded and the frame lead 36, and these are used to calculate corrected coordinates. The wire-bonding is then done automatically and continuously. During this process, the identification protrusions 36a function as markers for the detection of the bonding positions by the image recognition system.

This frame lead 36 is used as a lead for the power supply voltage (Vcc) or a reference voltage (Vss). If the frame lead 36 is used as the Vcc lead, for example, a plurality of power supply electrode pads 22 and a small number of inner leads 32 are each connected to the frame lead 36 by corresponding power supply wires 46. This enables a large reduction in the number of leads used for power supply. As a result, it becomes possible to increase the relative number of leads used as signal leads, enabling an increase in flexibility for the wiring between the electrode pads 22 of the semiconductor element 20 and the inner leads 32, which is advantageous from the design point of view.

The provision of the frame lead 36 also makes it possible to supply either a predetermined power supply voltage or a reference voltage to any electrode pad 22 of any position on the semiconductor element 20, enabling an increase in operating speeds while reducing the power supply noise.

Since the frame lead 36 is positioned outside the semiconductor element 20, there are few spatial restrictions and thus the frame lead 36 can be made sufficiently wide. Therefore, if the frame lead 36 is to be used as a power lead, the electrical resistance thereof can be reduced and thus a stable voltage can be supplied to any position on the semiconductor element 20.

Moreover, since the conducting layers 18a and 18b face the frame lead, the entire assembly functions as a capacitor when the frame lead 36 is used as a power lead, which not only reduces power supply noise, but it also enables rapid response.

The main functions and operations of this semiconductor device 100 are summarized below.

1. The heat generated by the semiconductor element 20 is efficiently dispersed through the highly thermally conductive radiator 10 of the semiconductor device 100, and is then released to the outside through the exposed surface 14 that is exposed from the resin package 60. Forming the radiator 10 as an inverted T-shape of cross section makes it possible to increase the surface area of the radiator 10, thus increasing the thermal radiation effect thereof.

Moreover, the distance from the exposed surface 14 to the mounting surface 12 can be greatly increased by providing a stepped configuration for the surface that is opposite to the mounting surface 12 that supports the semiconductor element 20, so that deterioration of the characteristics of the resultant device due to the influx of gases, water, or other foreign matter can be minimized. In addition short-circuiting from the inner leads 32 or the frame lead 36 to the radiator 10 can be prevented by the presence of the insulating layer 16 on the surface of the radiator 10. The dark color of the insulating layer 16 facilitates lead recognition during the wire-bonding process, and the insulating layer 16 also increases the adhesion with the resin package 60.

2. The frame lead 36 is provided between the semiconductor element 20 and the inner leads 32, and this frame lead 36 can be used as a power lead (Vcc or Vss lead). This means that a small number of inner leads 32 can be used to supply a predetermined voltage in a stable manner to power-supply electrode pads 22 that are formed at any desired locations on the semiconductor element 20, thus reducing power supply noise and enabling an increase in operating speeds.

The frame lead 36 also makes it possible to provide a common power lead so that the leads that are released by the use of this common lead can be used as signal leads, improving the flexibility of the wiring design.

In addition, since the frame lead 36 has identification protrusions 36a, confirmation of bonding positions by an image recognition system during the wire-bonding process is reliable and easy.

3. The conducting layers 18a and 18b, which are electrically connected to the conductive radiator 10, are provided on the mounting surface 12 of the radiator 10, and either the grounding electrode pads 22 of the semiconductor element 20 or the inner leads 32 are connected to the conducting layers 18a or 18b by corresponding grounding wires 44a or 44b. This means that any region can be grounded as required. As a result, since it is thus possible to reduce the number of grounding leads, more leads are available for use as signal leads, for example, further improving the flexibility of the wiring design.

The method of fabricating this semiconductor device 100 will now be described.

Figure 9:
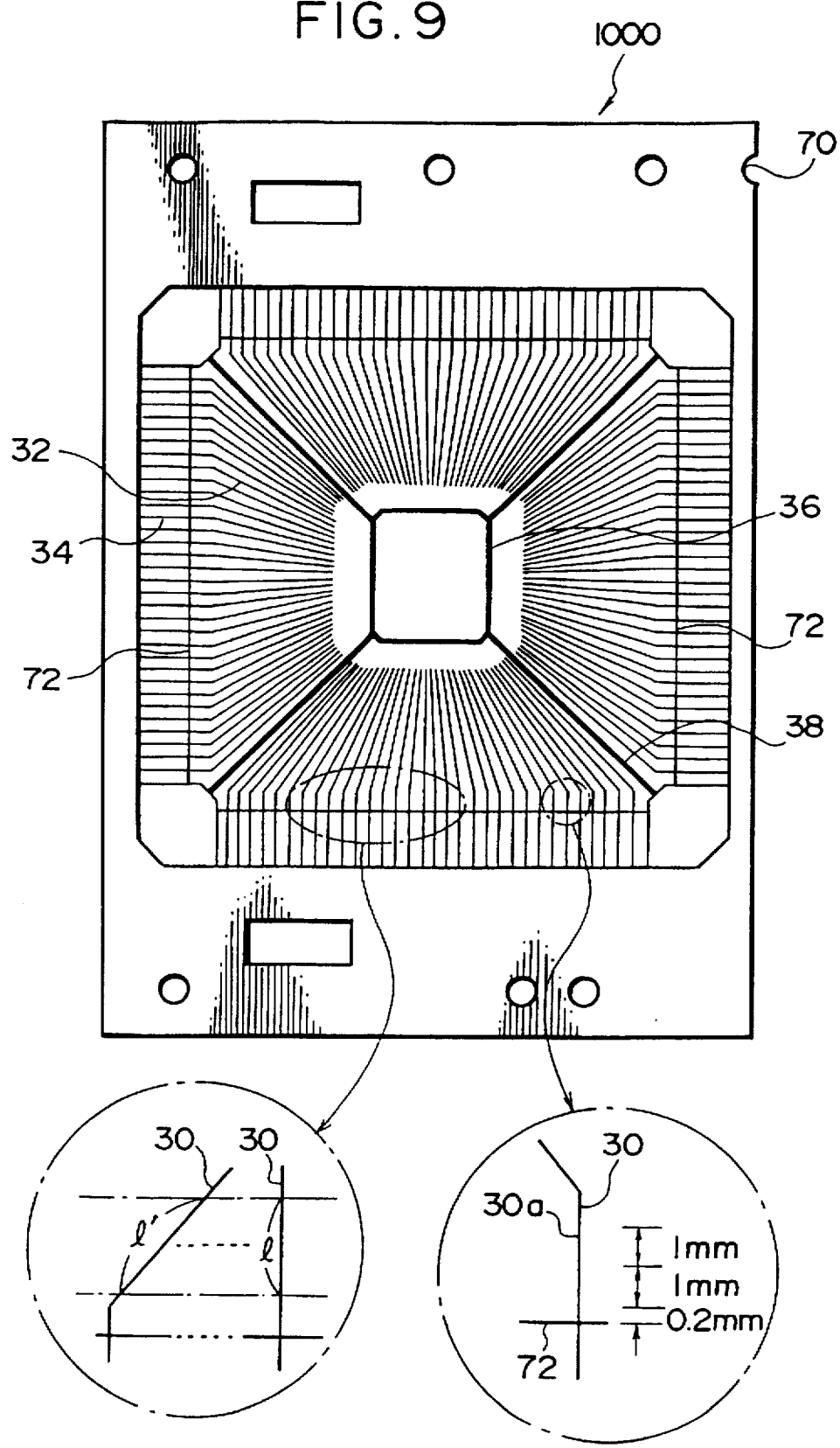
FIG. 9 is a plan view schematically showing the lead frame used in the fabrication of the semiconductor device of FIG. 4.

The description first concerns a lead frame 1000, with reference to FIG. 9. The lead frame 1000 is configured, by way of example, of the leads 30 (consisting of the inner leads 32 and outer leads 34), the frame lead 36, and the support leads 38, all formed in a predetermined pattern integrally with and supported by a substrate frame 70. The outer leads 34 are also linked together and reinforced by a dam bar portion 72. The inner leads 32 extend from the outer leads 34, leaving vacant a predetermined central region (the device hole) . The frame lead 36 is disposed within this region, the four corners of the frame lead 36 are supported by the support leads 38, and each of the support leads 38 is connected to the dam bar portion 72.

It should be noted that, although the frame lead 36 is supported by four support leads 38 in this embodiment, it is sufficient only that the support leads 38 support the frame sufficient only that the support leads 38 support the frame lead 36 stably, and other arrangements and numbers of support leads are possible within the scope of this invention, such as two support leads disposed facing each other.

The conducting layers 18a and 18b are then formed by a method such as silver-plating on predetermined regions of the radiator 10 that comprises the large portion 10a and the small portion 10b, as shown in FIGS. 4 and 5. These conducting layers 18a and 18b are masked, and the radiator 10 is immersed in a fluid such as "Ebonol" (trademark), made by Meltex Co., for several seconds to oxidize the surface and thus form the insulating layer 16. An insulating layer 16 formed in this way has a thickness of 2 μm to 3 μm, for example, and an electrical resistivity of $10^{13}$ Ωcm and more, and thus it has been confirmed to have good insulating properties.

It is equally possible to reverse the above procedure and form the conducting layers. 18a and 18b after the insulating layer 16 has been formed.

The semiconductor element 20 is bonded to a predetermined position on the mounting surface 12 of the radiator 10 obtained in this manner, using a conducting adhesive such as silver paste. Thereafter, the radiator 10, the lead support 50, and the lead frame 1000 are aligned and placed over each other, and these three components are fixed together by thermocompression bonding using an adhesive such as epoxy resin. A wire-bonding machine is then used to attach signal wires 42, grounding wires 44a and 44b, and power supply wires 46 in a predetermined pattern by a conventional method.

During this wire-bonding process, it is possible to prevent problems such as those that would be caused by neighboring wires coming into contact with each other, and thus ensure reliable wire bonding, by carrying out the wire bonding in such a manner that positions with shorter bonding distances are processed first. For example, the sequence could be the bonding of the grounding wires 44b, then the bonding of the power supply wires 46, and finally the bonding of the signal wires 42.

The radiator 10 on which the semiconductor element 20 and leads 30 are provided is then placed within an upper mold 200 and a lower mold 202, as shown in FIG. 1, and molding is performed using a resin such as an epoxy resin to form the resin package 60 (see FIG. 5). This molding is preferably performed with the exposed surface 14 of the radiator 10 exposed from the resin package 60.

To ensure that this occurs, the radiator 10 must be placed in intimate contact with the lower mold 202, to prevent the resin from seeping in between the radiator 10 and the lower mold 202.

For that reason, each lead 30 is pressed by the upper mold 200 in the direction of the surface thereof that is adhered to the lead support 50, as shown in FIG. 2, so that the radiator 10 is brought into intimate contact with the lower mold 202. Note that the lower mold 202 must be designed in such a manner that the leads 30 are suspended above a pinching portion 202a of the lower mold 202, as shown in FIG. 1, as a prerequisite for the above procedure.

More specifically, the sum of the height h of the radiator 10 and the thickness T of the lead support 50 (h+T) must be greater than the depth h1 of the lower mold 202, that is: h+T>h1. If, for example, the depth h1 of the lower mold 202 is 1.6 mm, the height h of the radiator 10 is 1.635 mm, and the error in h is ±0.035 mm, the thickness T of the lead support 50 is preferably 0.1 mm. Therefore, even in the worse case in which the error is h is −0.035 mm:

$$h+T=1.635-0.035+0.1=1.7 \text{ mm}>h1$$

thus maintaining the relationship: h+T>h1.

Since the leads 30 are thus positioned in a state in which they are suspended above the lower mold 202, the external force applied to the leads 30 from the upper mold 200 is also applied to the radiator 10. This external force applied from the upper mold 200 continues to act to press the radiator 10 downward, so that the radiator 10 is held in such a manner that it resists even the force of the resin flowing into the mold.

A characteristic feature of the configuration of this embodiment is the formation of a thin portion 30a in each of the leads 30. In other words, if the leads 30 were formed of a uniform thickness, the leads 30 could peel away from the lead support 50 when subjected to the above pressure, as shown in FIG. 13. However, the formation of the thin portion 30a makes it easy for each lead to deform elastically, preventing this problem. Note that an enlargement of the vicinity of one of the thin portions 30a is shown in FIG. 3.

More specifically, the thin portion 30a is formed by a wet etching method in the surface of each lead 30 that is opposite to the surface thereof attached to the lead support 50. This means that the thin portion 30a is formed by the creation of a concave portion with rounded edges. Since this thin portion 30a is formed as a concave portion with rounded edges, it is difficult for a crack to propagate when the lead 30 is elastically deformed.

The region in which the thin portion 30a is formed is set to be approximately 1 mm inward from the position that is sandwiched between the upper mold 200 and the lower mold 202. This prevents the thin portion 30a from being sandwiched between the upper mold 200 and the lower mold 202, and the incoming resin can not flow out along the thin portion 30a.

In addition, the thin portion 30a is preferably formed to be fairly long so that a large part of the lead 30 can deform elastically. In this configuration, the thin portion 30a is formed to extend as far as a position above the lead support 50. However, it should be noted that the length of this thin portion 30a in practice would be approximately 1 mm.

If this state is shown at the stage at which it is integrated with the lead frame 1000 (see FIG. 9), the thin portion 30a is formed for a length of 1 mm at a distance of 1 mm from the area with a length of 0.2 mm from the inner side of the dam bar portion 72 sandwiched between the upper mold 200 and the lower mold 202.

If the thickness of the leads 30 is about 0.15 mm, the thickness of the thin portion 30a is about half that: about 0.075 mm.

These thin portions 30a could be formed in all of the leads 30, but they could equally well be formed only in leads that are subjected to the greatest force in the direction that peels them away from the lead support 50, when pressure is applied by the upper mold 200.

More specifically, if the total number of the leads 30 is 208, 52 of these leads 30 will be formed along each side of a square lead frame 1000, but the thin portions 30a need to be formed in only about 30 of the leads in the central portion of each side.

These thin portions 30a are limited to these regions because, since the leads 30 are formed from each edge towards the center, the leads 30 in the central portion are shorter than those in the corner portions and thus are less able to deform elastically and are more likely to peel away from the lead support 50.

More specifically, it is clear from the enlarged detail shown in FIG. 9 that, if the lengths of any two of the leads between the dotted lines are compared, where l is the length of a lead 30 in the central portion and l' is the length of a lead in the corner portion, l<l'. It is also clear that the length l of the lead 30 in the central portion is less able to deform elastically than the length l' of the lead in the corner portion, and thus it is more likely to peel away from the lead support 50.

Therefore, if thin portions 30a are formed only in a predetermined number of the leads 30 in the central portion of each side, the leads 30 in these areas can be prevented from peeling away from the lead support 50. The leads 30 in the corner portions are inherently longer and thus can easily deform elastically, so that there is less need to form the thin portions 30a therein. Of course, if it is easier to form thin portions 30a in all of the leads 30, they can be so formed.

Thus thin portions 30a are formed in the leads 30. During the resin sealing process, the radiator 10 provided with the semiconductor element 20 and leads 30 is placed in the lower mold 202 as shown in FIG. 1. At this point, the leads 30 are suspended above the pinching portion 202a of the lower mold 202.

Next, the upper mold 200 closes downward to the lower mold 202, and a pinching portion 200a of the upper mold 200 presses down on the leads 30, as shown in FIG. 2. This causes the leads 30 to deform elastically, particularly the thin portions 30a thereof, and the elastic force thereof brings the radiator 10 into intimate contact with the lower mold 202.

In this state, a conventional molding process is performed. Thus resin is prevented from seeping under the radiator 10, and the resin package 60 can be formed with the exposed surface 14 exposed therefrom (see FIG. 5).

The substrate frame 70 (see FIG. 9) and dam bar portion 72 are then cut away, and the outer leads 34 are bent as required.

The above process makes it possible to fabricate a resin sealing type semiconductor device.

Figure 10:
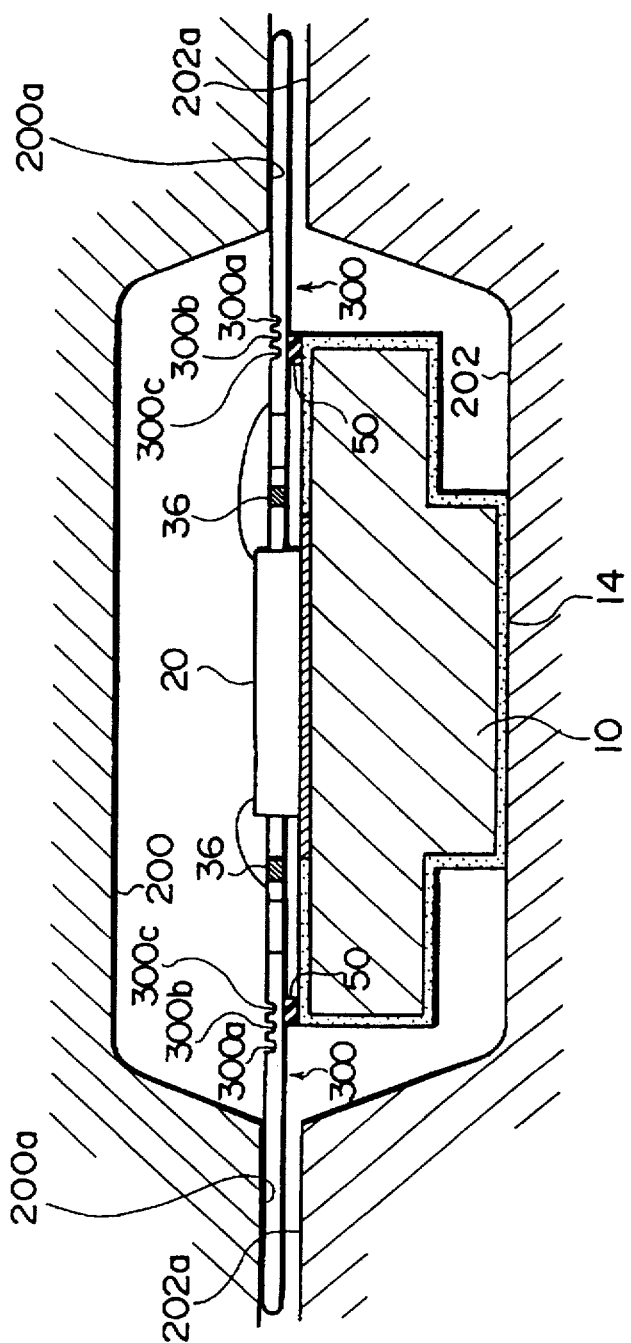
FIG. 10 is a view of the method of fabricating a semiconductor device in accordance with a variation of this invention.

A method of fabricating a semiconductor device that is a variation on the above embodiment will now be described with reference to FIG. 10. Leads 300 in this figure each have three thin portions 300a, 300b, and 300c. In all other points, the components shown in FIG. 10 are the same as those in FIG. 1, so the same reference numbers are given thereto and further description is omitted. Enlarged details of the attachment of the leads 300 of FIG. 10 to the radiator 10 are shown in FIGS. 11A and 11B.

Figure 11A:
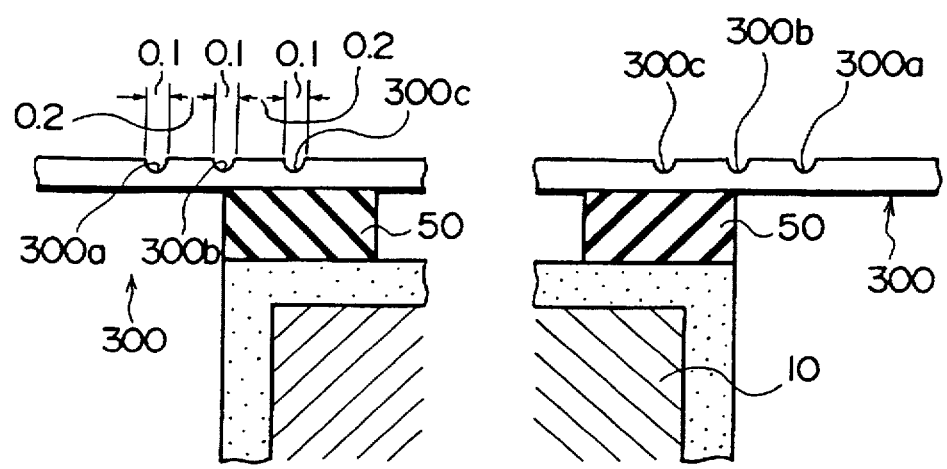
FIGS. 11A and 11B are enlarged views showing the attachment state of the lead of FIG. 10.
Figure 11B:
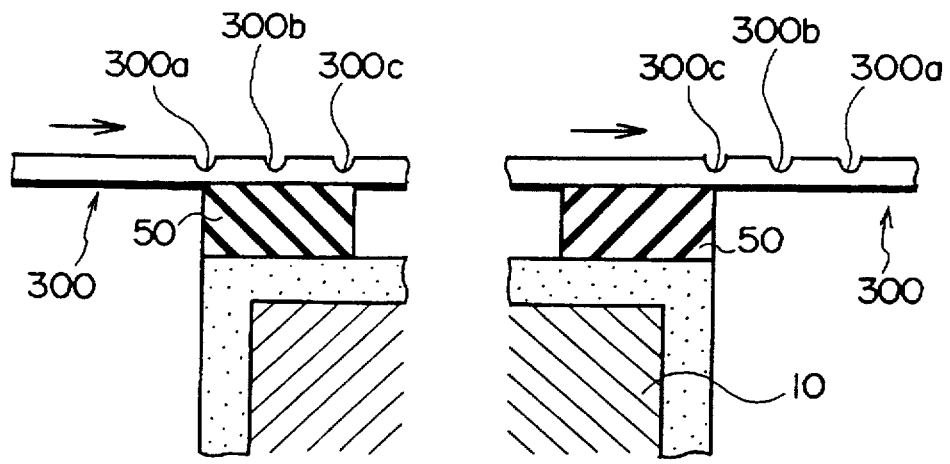

The thin portions 300a, 300b, and 300c of the leads 300 have the form of comparatively narrow grooves that are shaped with, for example, a width of 0.1 mm and at a pitch of 0.2 mm, as shown in FIG. 11A.

When the wide, thin portions 30a of FIG. 1 are formed by wet etching, it is considered possible that part of a thin portion 30a could become too thin because such etching is isotropic. That is why three narrow, thin portions 300a, 300b, and 300c are formed in the leads 300 of this embodiment. This prevents the thin portions 300a, 300b, and 300c from becoming too thin, and can prevent deformation, cracking, and twisting of the leads 300.

In the embodiment shown in FIG. 11A, the second thin portion 300b is designed to be at the outer edge of the lead support 50. As mentioned above, the objective of forming the thin portions is to prevent the leads 300 from peeling away from the lead support 50. That is why it is most preferable to form thin portions in such a manner that the leads 300 bend away at the edge of the mutual adhesion position, as shown in FIG. 11A.

In this embodiment, the thin portions 300a and 300c are formed on either side of the thin portion 300b. This ensures that thin portions 300a and 300c can adjust for any deviation in the adhesion position between the leads 300 and the lead support 50 that would place the thin portion 300b above the adhesion position with respect to the lead support 50, which would prevent it from functioning as designed.

If, for example, the thin portion 300b is moved to the right, as shown in FIG. 11B, the thin portion 300a will be positioned on the outer edge of the left-hand side of the lead support 50 whereas the thin portion 300c will be positioned on the outer edge of the right-hand side of the lead support 50.

Setting the pitch of the thin portions 300a, 300b, and 300c to be 0.2 mm is intended to allow for an error of ±0.3 mm in the adhesion position of the leads 300 and the lead support 50. In other words, since the width of each thin portion is 0.1 mm and the pitch thereof is 0.2 mm, the length from center to center of these thin portions is 0.3 mm, which enables accommodation of positioning errors of ±0.3 mm.

Figure 12:
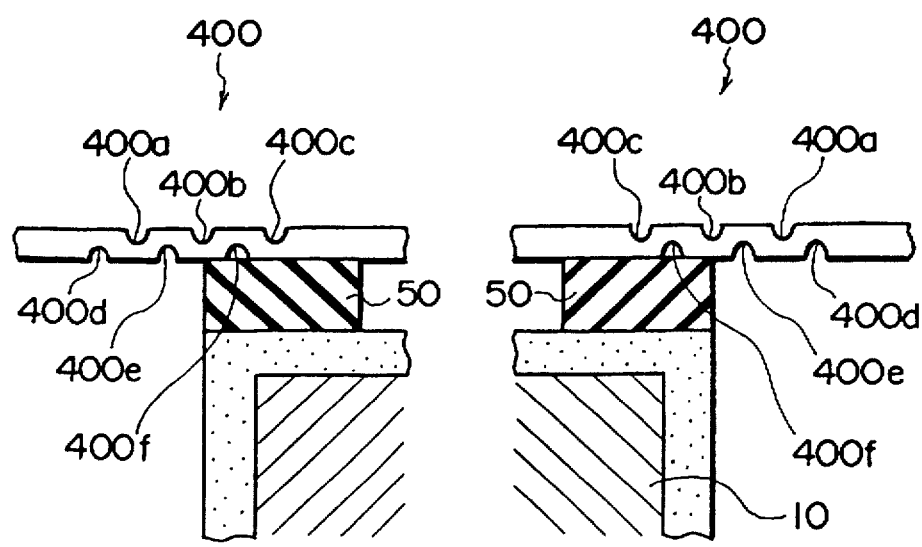
FIG. 12 shows a variation of the lead shown in FIGS. 11A and 11B.

A variation of the leads 300 of FIGS. 11A and 11B is shown in FIG. 12. In this figure, in addition to thin portions 400a, 400b, and 400c formed in one surface of each lead 400, thin portions 400d, 400e, and 400f are formed in the other surface thereof. More specifically, the thin portions in one surface are at different positions than the thin portions in the other surface. Therefore, either surface of the leads 400 can be used as the attachment surface when the leads 400 are attached to the lead support 50. It should be noted, however, that any gap formed between the thin portion 400f on the back surface and the lead support 50 will adversely affect the adhesion therebetween.

Note that this invention is an improvement to be added to a resin sealing type semiconductor device and method of making the same as disclosed in co-pending U.S. patent application Ser. No. 08/461,442, and it can be applied to the fabrication of all of the semiconductor device defined in the description and drawings thereof, and the entire disclosure of which is incorporated herein by reference.

In the above embodiments, the semiconductor element 20 was described as being attached to the radiator 10, but the present invention is not limited thereto. The semiconductor element could equally well be attached to a simple element mounting member that has poor thermal radiation characteristics.

This invention is also applicable to a configuration in which the leads do not have a frame lead 36, to enable appropriate setting and resin sealing.

What is claimed is:

1. A resin sealing type semiconductor device comprising:

a semiconductor element;

an element mounting member having a mounting surface for mounting said semiconductor element;

an insulating lead support disposed on said mounting surface of said element mounting member, said insulating lead support being separated from said semiconductor element;

a plurality of leads fixed to said element mounting member by adhesion to said insulating lead support; and a resin package sealing said element mounting member, said semiconductor element, and parts of said leads using a mold, at least one of said leads having at least one thin portion within a region sealed in resin, wherein said lead is bent at a position outside the area over which said lead is attached to said insulating lead support, said lead being bent in the direction toward said insulating lead support.

2. A resin sealing type semiconductor device comprising:

a semiconductor element;

an element mounting member having a mounting surface for mounting said semiconductor element;

an insulating lead support disposed on said mounting surface of said element mounting member, said insulating lead support being separated from said semiconductor element;

a plurality of leads fixed to said element mounting member by adhesion to said insulating lead support; and a resin package sealing said element mounting member, said semiconductor element, and parts of said leads using a mold, at least one of said leads having at least one thin portion within a region sealed in resin, wherein at least one of said leads has a plurality of thin portions and said thin portions comprise;

a first thin portion formed at any position between the interior of said mold and the outer side of the area over which said lead is attached to said insulating lead support;

a second thin portion formed at a position on an edge of the area over which said lead is attached to said insulating lead support; and a third thin portion formed in the area over which said lead is attached to said insulating lead support, wherein said lead is bent at a position outside the area over which said lead is attached to said insulating lead support, said lead being bent in the direction toward said insulating lead support.

3. A resin sealing type semiconductor device comprising:

a semiconductor element;

an element mounting member having a mounting surface for mounting said semiconductor element;

an insulating lead support disposed on said mounting surface of said element mounting member, said insulating lead support being separated from said semiconductor element;

a plurality of leads fixed to said element mounting member by adhesion to said insulating lead support; and a resin package sealing said element mounting member, said semiconductor element, and parts of said leads using a mold, at least one of said leads having at least one thin portion within a region sealed in resin, wherein said thin portion is formed of a depression in one surface of said lead, and wherein said lead is bent at a position outside the area over which said lead is attached to said insulating lead support, said lead being bent in the direction toward said insulating lead support.

4. A resin sealing type semiconductor device comprising:

a semiconductor element, an element mounting member having a mounting surface for mounting said semiconductor element;

an insulating lead support disposed on said mounting surface of said element mounting member, said insulating lead support being separated from said semiconductor element;

a plurality of leads fixed to said element mounting member by adhesion to said insulating lead support; and a resin package sealing said element mounting member, said semiconductor element, and parts of said leads using a mold, at least one of said leads having at least one thin portion within a region sealed in resin.

wherein at least one of said leads has a plurality of thin portions, at least one of said thin portions being formed of a depression in one surface of each of said leads, the remainder of said thin portions being formed of a depression in the other surface of each of said leads, and wherein said lead is bent at a position outside the area over which said lead is attached to said insulating lead support, said lead being bent in the direction toward said insulating lead support.

5. A resin sealing type semiconductor device comprising:

a semiconductor element;

an element mounting member having a mounting surface for mounting said semiconductor element;

an insulating lead support disposed on said mounting surface of said element mounting member, said insulating lead support being separated from said semiconductor element;

a plurality of leads fixed to said element mounting member by adhesion to said insulating lead support; and a resin package sealing said element mounting member, said semiconductor element, and parts of said leads using a mold, at least one of said leads having at least one thin portion within a region sealed in resin, wherein said element mounting member has a high heat-radiative property, and wherein said lead is bent at a position outside the area over which said lead is attached to said insulating lead support, said lead being bent in the direction toward said insulating lead support.

* * * * *